United States Patent [19]
Ozawa

[11] Patent Number: 5,965,308
[45] Date of Patent: *Oct. 12, 1999

[54] METHOD OF CONTROLLING EXPOSURE

[75] Inventor: Ken Ozawa, Tokyo, Japan

[73] Assignee: Nixon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/624,087

[22] Filed: Mar. 29, 1996

[30]     Foreign Application Priority Data

Nov. 17, 1995 [JP] Japan ................................. 7-299477

[51] Int. Cl.$^6$ ........................................................ G03F 9/00
[52] U.S. Cl. ................................................................ 430/30
[58] Field of Search .............................. 355/67, 68, 69, 355/71; 250/559.11, 492.23; 430/30

[56]             References Cited

U.S. PATENT DOCUMENTS

| | | | |
|---|---|---|---|
| 4,711,568 | 12/1987 | Torigoe et al. | 355/68 |
| 4,908,656 | 3/1990 | Suwa et al. | 355/53 |
| 5,097,291 | 3/1992 | Suzuki | 355/69 |
| 5,191,374 | 3/1993 | Hazama et al. | 355/43 |
| 5,309,198 | 5/1994 | Nakagawa | 355/67 |
| 5,329,336 | 7/1994 | Hirano et al. | 355/53 |
| 5,363,171 | 11/1994 | Mack | 355/68 |
| 5,491,534 | 2/1996 | Shiozawa | 355/69 |
| 5,561,290 | 10/1996 | Strobel et al. | 250/252.1 |
| 5,608,492 | 3/1997 | Sato | 355/68 |
| 5,627,627 | 5/1997 | Suzuki | 355/68 |
| 5,677,754 | 10/1997 | Makinouchi | 355/53 |
| 5,861,944 | 1/1999 | Nishi | 355/68 |

*Primary Examiner*—Christopher G. Young
*Attorney, Agent, or Firm*—Foley & Lardner

[57]             ABSTRACT

The exposure quantity with respect to a wafer is correctly measured under each illumination condition even when illumination conditions are changed over. Under each of conditions where the σ value (coherence factor) of an illumination optical system is set to various values including its small, standard, and large values, a correlation data between the output (E) of a reference illuminance meter and the output (I) of an integrator sensor is obtained. With respect to the correlation data for the respective σ values, approximate lines (24A, 24B, 24C, etc) are determined by the method of least squares and then gradients of these lines are stored as correlation coefficients (α). Under the illumination condition corresponding to each σ value, the output (I) of the integrator sensor is divided by its corresponding correlation coefficient (α) so as to compute the exposure energy on the image surface.

30 Claims, 7 Drawing Sheets

METHOD OF CONTROLLING EXPOSURE

BACKGROUND OF THE INVENTION

1. Field of the Invention

The present invention relates to an exposure apparatus used for transferring a mask pattern onto a photosensitive substrate in a lithography process for making, for example, a semiconductor device, a liquid crystal display device, an image pickup device (CCD or the like), or a thin film magnetic head and, in particular, to an exposure apparatus having a function of controlling its exposure quantity with respect to the photosensitive substrate.

2. Related Background Art

An exposure apparatus is an apparatus for projecting a desired pattern onto an optically sensitive material (photoresist). Such an exposure apparatus is disclosed in U.S. Pat. Nos. 4,908,656 and 5,191,374.

SUMMARY OF THE INVENTION

The present invention relates to an exposure apparatus which irradiates a photoresist coated on an object with exposure light thereon. This exposure apparatus comprises a stage on which the object is disposed, an illumination optical system which emits exposure light, and a projection optical system which projects the emitted exposure light onto the object disposed on the stage. The illumination optical system has an aperture stop with a variable aperture ratio which can be adjusted so as to change the coherence factor ($\sigma$ value) of the exposure apparatus. Since the $\sigma$ value can be changed, this exposure apparatus can optimize its exposure operation according to the form of the pattern to be projected and the kind of the photoresist used. This aperture stop is driven by a driver which is controlled by a computer.

This exposure apparatus further comprises an optical separator device which separates the exposure light, a photodetector which detects a part of thus separated exposure light, and an illuminance meter disposed on the stage. The output of the photodetector is calibrated by the computer based on the relationship between the illuminance on the photoresist which has been measured by the illuminance meter beforehand and the output of the photodetector at a predetermined $\sigma$ value selected from a plurality of $\sigma$ values. Namely, the computer stores a plurality of $\sigma$ values and the relationships between the outputs of the illuminance meter and photodetector corresponding to the respective $\sigma$ values.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, an embodiment of the exposure apparatus in accordance with the present invention will be explained with reference to FIGS. 1 to 9. Here, identical elements will be referred to with identical marks without repeating their overlapping explanations.

Figure 1:
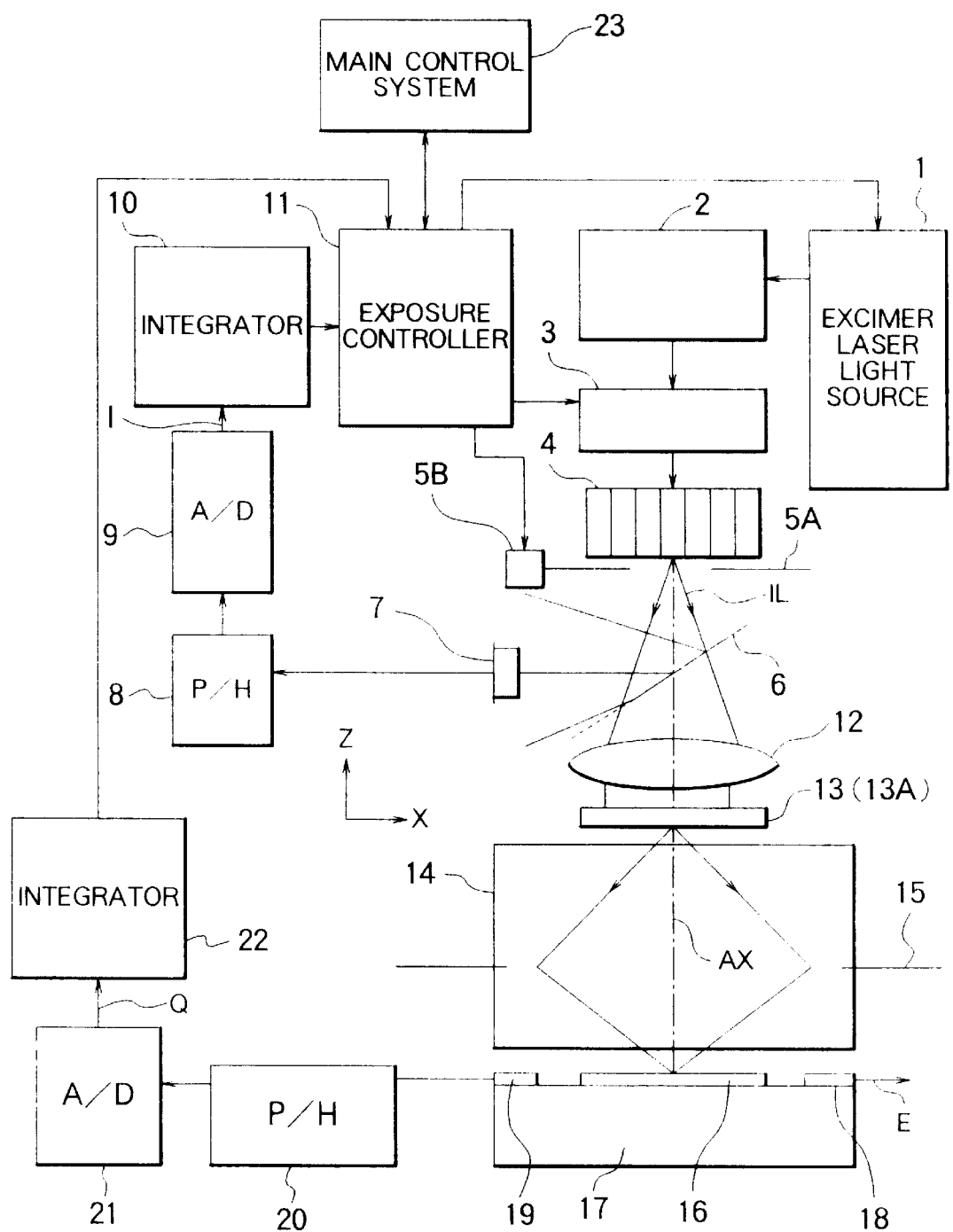
FIG. 1 is a schematic view showing a configuration of the projection exposure apparatus in an embodiment of the present invention.

FIG. 1 shows a projection exposure apparatus in this embodiment. This exposure apparatus is a stepper type exposure apparatus and comprises an exposure light source 1 for irradiating a wafer 16 with exposure light thereon and a stage 17 for relatively moving the wafer 16 with respect to the irradiating position of the exposure light.

The light source 1 is a pulse light source or, more specifically, a KrF excimer laser light source. The wavelength (oscillation wavelength) of the light emitted from the KrF excimer laser light source 1 is 248 nm. While the explanation in this embodiment relates to the exposure apparatus using a KrF excimer laser as the light source 1, other light sources such as an ArF excimer laser light source with an oscillation wavelength of 193 nm may be used as the light source 1 in place of the KrF excimer laser light source. The energy of the light emitted from the light source 1 is controlled by an energy extinction unit 3 which will be explained later.

Here, in place of the pulse light source, a mercury lamp emitting continuous light may be used as the light source 1. When the mercury lamp is used as the light source 1, a short wavelength component such as i-line (wavelength of 365 nm), in particular, is selectively used as the exposure light. When the mercury lamp emitting the continuous light is used, however, the exposure quantity control effecting extinction is unnecessary and a single illumination condition is used at the time of exposure. When there is a single illumination condition, the calibration of the integrator sensor, which will be explained later, may as well be effected at a single point in an extreme case. Accordingly, when the mercury lamp is used as the light source 1, the necessity for calibrating the output of the integrator sensor with a plurality of calibration values is little.

Within a light pathway between the light source 1 and the stage 17, a beam shaping optical system 2, the energy extinction unit 3, a fly-eye lens 4, an aperture stop 5A, a beam splitter 6, a condenser lens 12, a reticle 13, and a projection optical unit 14 are successively disposed.

First, the illumination optical system constituted by the light source 1, beam shaping optical system 2, energy extinction unit 3, fly-eye lens 4, aperture stop 5A, and condenser lens 12 will be explained. The pulse illumination light (laser beam) emitted from the light source 1 enters the beam shaping optical system 2 which is constituted by a cylinder lens, a beam expander, and the like. The beam shaping optical system 2 shapes the cross-sectional form of the incident beam such that thus shaped beam is emitted therefrom so as to be efficiently incident on the subsequent fly-eye lens 4.

The pulse illumination light emitted from the beam shaping optical system 2 enters the energy extinction unit (optical attenuator unit) 3. The energy extinction unit 3 is constituted by a rough adjustment unit which comprises a plurality of ND filters with different transmittance values (not depicted) and by which the transmittance with respect to the incident light is roughly changed over in a plurality of steps. For the configuration of such a unit, reference is made to U.S. Pat. No. 5,191,374. The energy extinction unit 3 sets the extinction ratio with respect to the incident light to a value corresponding to the instruction from an exposure controller 11.

Here, the extinction ratio instructed from the exposure controller 11 to the energy extinction unit 3 will be explained. In cases where the photoresist on the wafer, which is the object to be exposed to light, has a high sensitivity (the exposure quantity is set low), in principle, an ND filter satisfying the minimum exposure pulse number condition for attaining its desired reproducibility in the exposure quantity control is selected, though it may vary in conjunction with the illuminance on the wafer surface (image-forming surface) under no extinction as well as the aperture ratio of the aperture stop in the illumination system. Accordingly, as the coherence factor (σ value) of the illumination optical system is greater and the aperture ratio of the aperture stop in the illumination system is greater, it becomes necessary for the extinction ratio to have a larger range, whereby the output value has to be calibrated in a wider range in the integrator sensor which will be explained later.

The pulse illumination light emitted from the energy extinction unit 3 enters the fly-eye lens 4. The fly-eye lens 4 forms a plurality of secondary light sources for illuminating the subsequent reticle 13 with a uniform illumination distribution. For the configuration of the fly-eye lens 4, reference is made to U.S. Pat. No. 5,191,374.

On the exit surface of the fly-eye lens 4, the aperture stop 5A (referred to as "σ stop" hereinafter) of the illumination system is disposed. The form of the aperture of the σ stop 5A is substantially circular. The aperture size of the a stop 5A is changed by a driving portion 5B. The exposure controller 11 transmits an instruction for adjusting the diameter of the aperture of the σ stop 5A to the driving portion 5B so as to set the numerical aperture (N.A.) of the σ stop 5A to a desired value. The ratio of the numerical aperture of the illumination optical system to that of the projection optical system 14 is the coherence factor (σ value). Accordingly, as the exposure controller 11 controls the numerical aperture of the illumination optical system by way of the driving portion 5B, the σ value of the exposure apparatus can be controlled.

Pulse illumination light IL which has been emitted from the fly-eye lens 4, which is composed of a plurality of secondary light sources, and passed through the σ stop 5A impinges on the beam splitter 6 which has a reflectivity smaller than its transmittance. Accordingly, the greater part of the pulse illumination light IL irradiating the beam splitter 6 thereunder passes through the beam splitter 6, while the remaining smaller part thereof is reflected by the beam splitter 6.

The pulse illumination light passing through the beam splitter 6 illuminates, by way of the condenser lens 12, the mask or reticle 13 with a uniform illuminance distribution. The reticle 13 is mounted on a reticle stage (not depicted) which positions the reticle 13 within XY plane (horizontal plane). Though not depicted, a relay lens system and a field stop (reticle blind) are disposed between the beam splitter 6 and the condenser lens 12. This field stop sets the illumination area on the reticle 13.

The reticle 13 has a pattern to be projected onto the photoresist on the wafer 16. Between the reticle 13 and the stage 17, on which the wafer 16 is to be mounted, the projection optical system 14 is disposed. Here, the axis parallel to optical axis AX of the projection optical system 14 is defined as Z axis. Within a plane perpendicular to the Z axis, the axis parallel to the paper surface of FIG. 1 is defined as X axis, while the axis perpendicular to the paper surface of FIG. 1 is defined as Y axis, whereby the XY plane defines a horizontal plane. The wafer 16 is mounted, by way of a wafer holder (not depicted), on the wafer stage 17 which positions the wafer 16 in X, Y, and Z directions and the like.

Next, the projection optical system 14 will be explained. The projection optical system 14 is a telecentric system. Namely, on the pupil surface of the projection optical system 14 (Fourier transform surface with respect to the reticle 13), an aperture stop 15 is disposed. Here, the projection optical system 14 may further comprise an aperture stop facing the reticle 13. By way of the projection optical system 14 which is telecentric on both sides (or on one side facing the wafer), the pattern on the reticle 13 is reduced with a projection magnification β (which is, for example, ⅕) so as to be projected onto one shot area on the wafer 16 which is coated with the photoresist.

Next, the measurement of illuminance will be explained. On the wafer stage 17, a reference illuminance meter 18 is detachably disposed. The height of the light-receiving surface of the reference illuminance meter 18 from the surface of the stage 17 is the same as that of the surface of the wafer 16 from the surface of the stage 17. The reference illuminance meter 18 is constituted by a pyroelectric detector, a calorimeter, or the like. Output E [mJ/(cm$^2$ pulse)] of the reference illuminance meter 18 is traceable with respect to a standard illuminance meter of NIST (National Institute of Standards and Technology) or the like. Also, it is assumed that the reference illuminance meter 18 is isotropic (satisfies Lambert's law) with respect to the incident angle of detection light. Namely, the output E of the reference illuminance meter 18 changes by cosθ with respect to the incident angle θ of the detection light. Further, it is assumed that the output E of the reference illuminance meter 18 satisfies a predetermined linearity with respect to the range of incident energy density on the wafer required on the projection exposure apparatus side.

On the wafer stage 17, an illuminance fluctuation sensor 19 is permanently disposed. The illuminance fluctuation sensor 19 is composed of a photoelectric detector (photodetector) such as a PIN type photodiode. The height of the light-receiving surface of the illuminance fluctuation sensor 19 from the surface of the stage 17 is the same as that of the surface of the wafer 16 from the surface of the stage 17. The light-receiving surface of the illuminance fluctuation sensor 19 is covered with a cover (not depicted) having a pinhole with a predetermined size and receives an illumination light component which has passed through this pinhole.

As the wafer stage 17 is driven, the pinhole (not depicted) of the illuminance fluctuation sensor 19 moves within an exposure field of the projection optical system 14. Accordingly, when the output of the illuminance fluctuation sensor 19 is taken out while the wafer stage 17 is scanned in X and Y directions, the fluctuation in illuminance within this exposure field can be detected. In this embodiment, however, as explained later, the output of the illuminance fluctuation sensor 19 is used to calibrate the output of an integrator sensor 7.

The photoelectrically converted signal of the illuminance fluctuation sensor 19 is, by way of a peak-hold circuit (referred to as "P/H circuit" hereinafter) 20 and an analog/digital (A/D) converter 21, converted into a digital output Q [digit/pulse], which is then integrated by an integrator 22 for a predetermined period such that the result of integration is supplied to the exposure controller 11.

On the other hand, the component of pulse illumination light IL reflected by the beam splitter 6 is received by the integrator sensor 7. The integrator sensor 7 is composed of a photoelectric detector (photodetector) such as a PIN type photodiode. The photoelectrically converted signal from the integrator sensor 7 is, by way of a P/H circuit 8 and an A/D converter 9, converted into a digital output I [digit/pulse], which is then integrated by an integrator 10 for a predetermined period such that the result of integration is supplied to the exposure controller 11.

Also in the integrator sensor 7, it is assumed that the peak value of the pulse signal detected by the P/H circuit 9 is the exposure energy per pulse. In the following, the digital output I [digit/pulse] from the A/D converter 9 is assumed to be the output of the integrator sensor 7 per pulse illumination light. Here, a condenser lens may be disposed between the beam splitter 6 and the integrator sensor 7.

Into the exposure controller 11, the result of integration (I·t) of the output I from the integrator sensor 7 and the result of integration (Q·t) (exposure quantity) of the output Q from the illuminance fluctuation sensor 19 are input. Here, t is the pulse number of the illumination light IL. By using the output of the exposure fluctuation sensor 19, the exposure controller 11 calibrates the output of the integrator sensor 7. The exposure controller 11 is a computer comprising a memory M1 and a central processing unit C1. The exposure controller 11 runs a program including a plurality of instructions stored in the memory M1. In the memory M1 of the exposure controller 11, an instruction to convert the result of integration (I·t) into the result of integration (Q·t) on the basis of the a value has been written. Namely, within the memory M1, a correlation function for obtaining the exposure energy per pulse of the pulse illumination light IL on the surface of the wafer 16 has been stored. The exposure controller 11 determines the integrated exposure quantity at each point on the wafer 16 on the basis of the output data from the integrator 10 and its correlation function and supplies thus determined quantity to a main control system 23. Here, in place of the illuminance fluctuation sensor (illuminance meter) 19, the reference illuminance meter 18 may be used.

The main control system 23 is constituted by a computer 23A, a display D, and a keyboard K. The computer 23A comprises a memory M2 and a central processing unit C2.

To the exposure controller 11, the main control system 23 transmits the coherence factor (σ value) corresponding to the reticle 13, information concerning the exposure quantity (sensitivity) which has been set with respect to the photoresist on the wafer 16, and the instruction to start the exposure. In response thereto, the exposure controller 11 sets the extinction ratio of the energy extinction unit 3 and then supplies an emission trigger signal to the excimer laser light source 1 so as to control the emission timing and emission period of the excimer laser light source 1.

Next, an example of the exposure quantity control operation in this embodiment will be explained. In the following explanation, the system for controlling the exposure quantity is assumed to be based on a cut-off control which is used in a collective exposure system. Recently, there has also been used a scan exposure type projection exposure apparatus such as a step and scan type system in which, while a part of a pattern of a reticle is projected onto a wafer, the reticle and the wafer are scanned in synchronization with each other such that the reticle pattern is successively transferred to the respective shot areas on the wafer. Both systems are equivalent in that the integrator sensor is desired to be correctly calibrated in full range.

First, a case where the number of the kinds of the photoresist used is small and it is not necessary for the integrator sensor 7 to have a very wide range will be explained with reference to the flow chart of FIG. 7.

In place of the reticle 13 shown in FIG. 1, a reticle 13A with no pattern is disposed (S1). This disposing operation is performed as a disposing command is input from the keyboard K of the main control system 23 into the computer 23A. When the disposing command is input into the computer 23A, the main control system 23 transmits a control signal to an automatic reticle loader ARL. When the control signal is input, the automatic reticle loader selects a predetermined reticle from a reticle library which is not depicted and transfers thus selected reticle to a reticle stage (holder) which is not depicted.

Then, from the keyboard K, a moving command is input into the computer 23A. When the moving command is input, the computer 23A moves the stage 17 such that the light-receiving surface of the reference illuminance meter 18 on the wafer stage 17 is positioned at the center portion of the irradiation field of the projection optical system 14 (S2).

Subsequently, a standard stop command is input from the keyboard K into the computer 23A. When this command is input, the main control system 23 instructs the exposure controller about it. When this instruction is received, the exposure controller 11 transmits a control signal to the driver 5B so as to set the aperture size of the σ stop 5A to a standard size. Accordingly, by means of the σ stop 5A, the a value of the illumination optical system is set to its standard value (S3).

Next, from the keyboard K, the N-th extinction command is input into the computer 23A. When this command is input, the main control system 23 instructs the exposure controller 11 about it. The exposure controller 11 controls the energy extinction unit 3 so as to set the extinction ratio to the N-th extinction ratio (S4).

Then, an emission command is input from the keyboard K into the computer 23A. When this command is input, the main control system 23 instructs the exposure controller 11 about it and then, in response to this instruction, the exposure controller 11 transmits a trigger signal to the light source 1. Accordingly, the excimer laser light source 1 is subjected to pulse emission (S5). Though the number of the pulses emitted here is one, it may be more than one as well.

Subsequently, in response to the emission at the light source 1, the exposure controller 11 detects the output I from the integrator sensor 7 and the output E from the reference illuminance meter 18 and then stores these output data into the memory M1 (S6). After the light source 1 has effected a predetermined number of emissions, the exposure controller 11 makes the latter stop the emission (S7). The exposure controller 11 takes out the output I of the integrator sensor 7 and the output E of the reference illuminance meter 18 while changing the energy of the pulse illumination light, by way of the energy extinction unit 3, in about 10 steps, for example, within the range in which the whole sensitivity of the subject photoresist is considered. Namely, until the extinction ratio is changed from N=1 to N=10, the exposure controller 11 repeats the processes from step 4 (S4) to step 7 (S7) while storing the output data corresponding to the respective extinction ratios N into the memory M1 (S8).

Next, from the output data corresponding to each extinction ratio, the exposure controller 11 determines a correlation coefficient between the output I of the integrator sensor 7 per pulse illumination light and the output E of the reference illuminance meter 18 (S9). Here, when there are a plurality of pulses in a single emission, the exposure controller 11 divides the energy of the pulse illumination light detected after the emission has become stable by the number of pulses of the pulse illumination light emitted during the time in which the emission is stable, thereby computing the outputs I and E per pulse.

Figure 2:
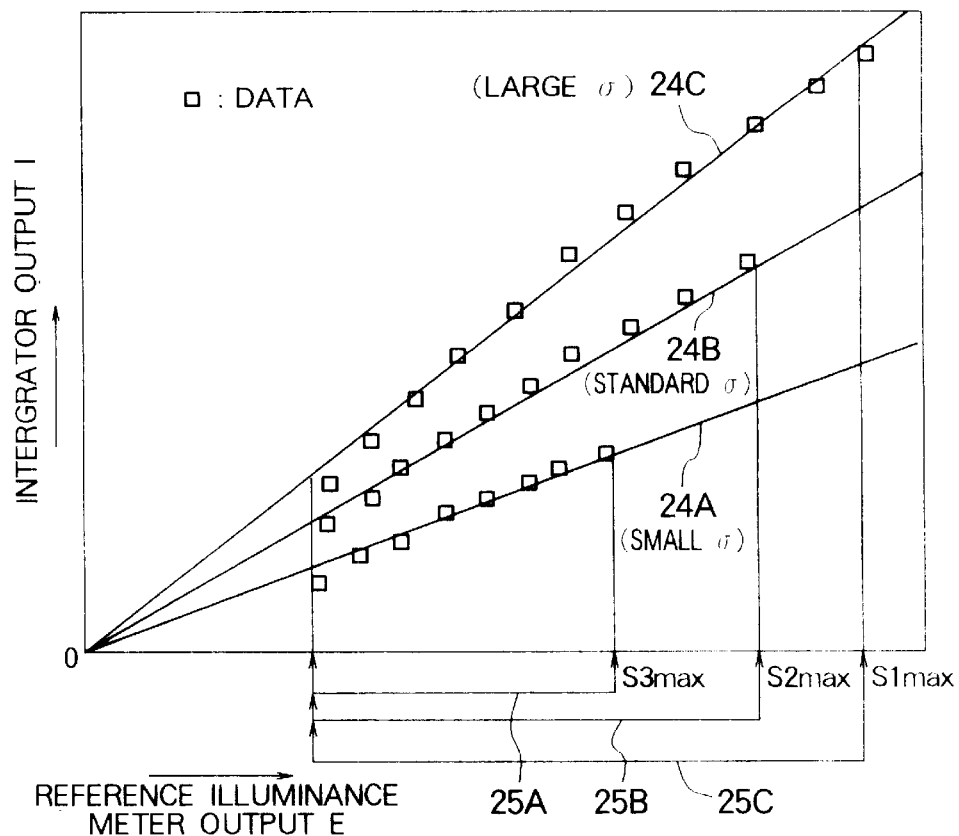
FIG. 2 is a chart showing linear correlations between the output of a reference illuminance meter 18 and the output of an integrator sensor 7 measured in the above-mentioned embodiment while illumination conditions are changed.

In the following, the computation of the correlation coefficient will be explained. In FIG. 2, line 24B indicates a line corresponding to the data (correlation data) taken into the memory M1 of the exposure controller 11. In FIG. 2, the horizontal axis indicates the output E [mJ/(cm²pulse)] of the reference illuminance meter 18, whereas the vertical axis indicates the output I [digit/pulse] of the integrator sensor 7. This line 24B is obtained when a plurality of data taken with its standard $\alpha$ value is approximated by a line according to the method of least squares while the offset value of the output I of the integrator sensor 7 is eliminated. The gradient of the line 24B is stored in the memory M1 within the exposure controller 11 as a correlation coefficient $\alpha$ [digit/(mJ/cm²)]. Accordingly, the result obtained when the output I [digit/pulse] per pulse illumination light detected by the integrator sensor 7 is divided by the correlation coefficient $\alpha$ represents the energy density supplied onto the image surface, namely, the wafer 16 or the reference illuminance meter 18. When the aperture size of the $\sigma$ stop 5A is a standard value $A_i$ (i=1), computed correlation function $R_i$ (i=1) is stored into the memory M1. When the above-mentioned linear approximation is used, the correlation function is:

$$R_i \text{ (input)} = \text{input}/\alpha_i$$

In other words, the output E of the reference illuminance meter and the output I of the integrator sensor is expressed by the following equation 1:

$$I = E \cdot \alpha_i \quad \text{(equation 1)}$$

Next, while the aperture size of the $\alpha$ stop 5A is changed so as to change the $\sigma$ value of the illumination system into various values $\sigma_i$ (i=1, 2, . . . ), correlation data between the output I of the integrator sensor 7 and the output E of the reference illuminance meter 18 are collected. Namely, at step 3 (S3), by using the keyboard K, the aperture size of the $\sigma$ stop 5A is reset from the standard value to another value $A_i$ (i=2, 3, . . . ) (wherein the $\sigma$ value of the illumination optical system is $\sigma_i$ when the aperture size is $A_i$) and then the processes from step 3 (S3) to step 9 (S9) are performed. By these processes, the correlation functions $R_i$ (i=2, 3, . . . ) for the respective aperture sizes $A_i$ (i=2, 3, . . . ) are computed. The range within which the $\sigma$ value is changed extends to the whole range which is necessary when the subject photoresist is used. Accordingly, the correlation function $R_i$ corresponding to the coherence factor $\sigma_i$ is stored into the memory M1. Here, since the output E from the reference illuminance meter 18 and the output Q of the illuminance fluctuation sensor 19 are interchangeable, the output Q of the illumination fluctuation sensor 19 may be used in place of the output E of the reference illuminance meter 18.

FIG. 2 shows, as examples, correlation data in cases where the $\sigma$ value is made small and large (data along lines 24A and 24C, respectively). In each case, the correlation data for the individual $\sigma$ value $\sigma_i$ is approximated by a line according to the method of least squares and its correlation coefficient $\alpha_i$ [digit/(mJ/cm²)] is obtained as the gradient of this line. Thus obtained correlation coefficient $\alpha_i$ for each $\alpha_i$ (for every illumination condition) is held in the memory M1 within the exposure controller 11 as a parameter.

Though there has recently been developed an illumination optical system which can prevent the utilization efficiency of the illumination light from deteriorating even when the $\alpha$ value is changed as the $\alpha$ stop is changed, it is assumed in this example that the power of the pulse illumination light decreases in proportion to the aperture ratio of the $\alpha$ stop 5A. In this case, as shown in FIG. 2, the range within which the extinction has to be effected in order to control the exposure quantity becomes smaller as the $\alpha$ value is smaller. Namely, in FIG. 2, range 25A (range from the minimum value to S3max), range 25B (range from the minimum value to S2max), and range 25C (range from the minimum value to S1max) of the output E of the reference illuminance meter 18 indicate necessary control ranges in cases where the $\sigma$ value is small, standard, and large, respectively.

Figure 8:
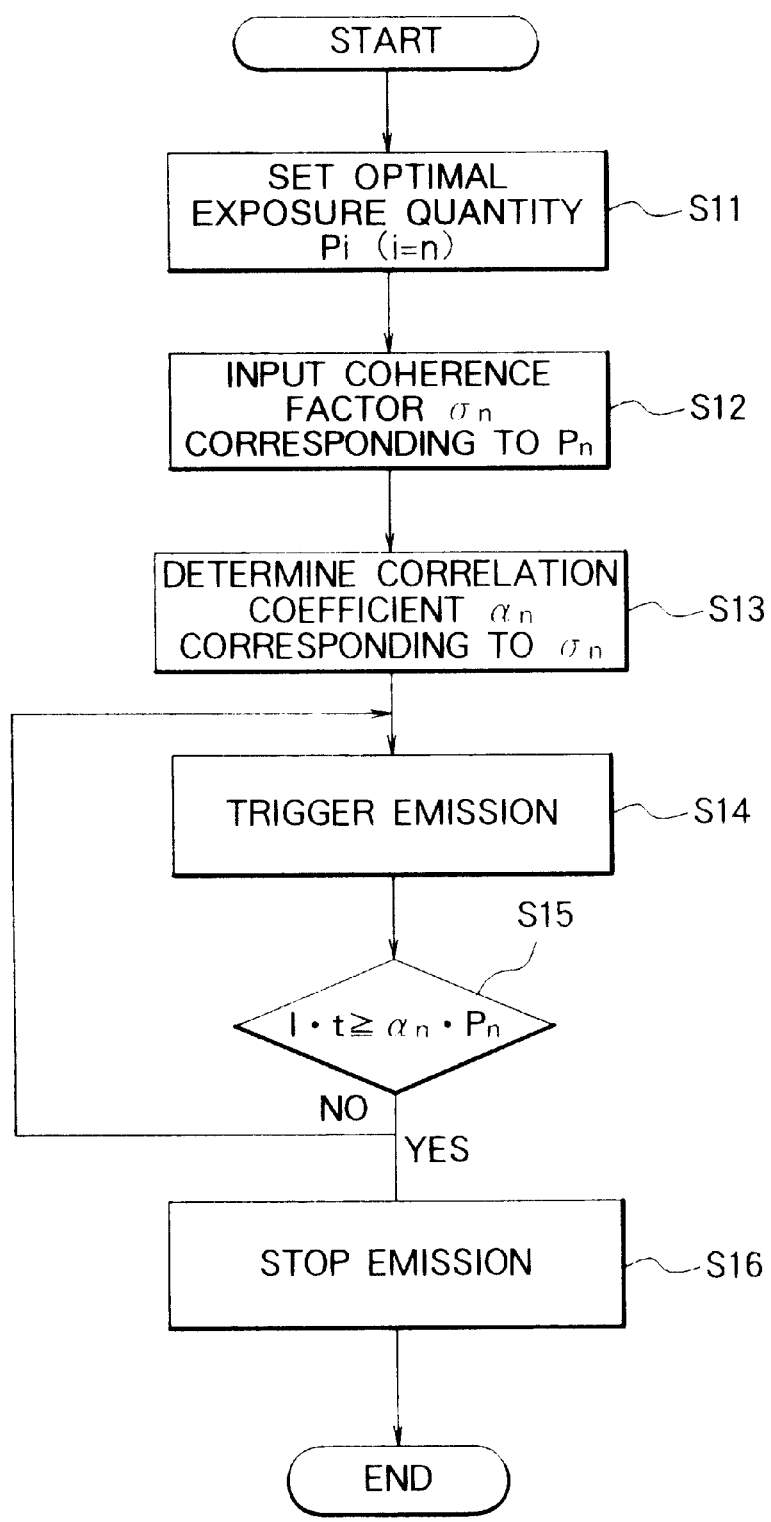
FIG. 8 is a flow chart for explaining a control operation of the exposure apparatus.

The case where the exposure controller 11 shown in FIG. 1 performs a cutoff control of emission when equation 1 is used as the correlation function will be explained with reference to FIG. 8. First, in response to the sensitivity of the photoresist, optimal exposure quantity $P_i$ is set (S11). Namely, from the keyboard K, the optimal exposure quantity $P_i$ (i=n) is input into the computer 23A. When this command is input, the main control system 23 instructs the exposure controller 11 about it. Here, this setting may be effected in view of the pattern of the reticle 13. When the optimal exposure quantity is $P_i$ (i=n), the optimal coherence factor $\alpha_i$ is univocally determined. From the keyboard K, the coherence factor $\alpha_i$ (i=n) is input into the computer 23A (S12). When this command is input, the main control system 23 instructs the exposure controller 11 about it. When this command is input into the exposure controller 11, since the corresponding relationship between the correlation coefficient $\alpha_i$ and value $\sigma_i$ has been stored within the memory M1, correlation coefficient $\alpha_n$ is determined (S13).

The optimal exposure quantity $P_i$ is obtained when the exposure energy E (output of the reference illumination meter 18) per pulse of the exposure light irradiating the photoresist is multiplied by the pulse number t. Namely, $P_i = E \cdot t$. Accordingly, when the correlation coefficient is $\alpha_i$, $\alpha_i \cdot P_i = I \cdot t$ is derived from equation 1. Accordingly, when the illuminance (energy) measured by the reference illuminance meter 18 is E, the output (I·t) of the integrator sensor 7 integrated by the integrator 10 equals $\alpha_i \cdot P_i$. Namely, this relationship is indicated by the following equation 2:

$$\alpha_i \cdot P_i = I \cdot t \quad \text{(equation 2)}$$

Here, $P_n$ and $\alpha_n$ are input into the optimal exposure quantity $P_i$ and the correlation coefficient $\alpha_i$ at step 11 (S11) and step 13 (S13), respectively.

After the correlation coefficient $\alpha_n$ is determined, the exposure operation is performed in the following manner. The exposure controller 11 multiplies the exposure quantity which has been set with respect to the photoresist on the wafer 16 by its correlation coefficient $\alpha$, thereby converting the set exposure quantity into a digital quantity so as to compute a cutoff level determined by a desired reproducibility in exposure quantity control. Then, at the time when the value which is obtained by the integrator 10 as it integrates the output I from the integrator sensor 7 reaches this cutoff level, the pulse emission of the excimer laser light source 1 is stopped.

Namely, first, an emission command is input from the keyboard K into the computer 23A. When this command is input, the main control system 23 instructs the exposure controller 11 about it. In response to this instruction, the exposure controller 11 transmits a trigger signal to the light source 1 (S14). Accordingly, the excimer laser light source 1 is subjected to pulse emission. From the time when the exposure is started, the exposure controller 11 always senses the output (I·t) of the integrator 10 (S15). When the exposure controller 11 judges that this output (I·t) equals or exceeds $\alpha_n \cdot P_n$, it stops supplying the trigger signal to the light source 1, thereby terminating the emission at the light source (S16). Namely, the exposure controller 11 transmits the trigger signal to the light source 1 until the number t of the trigger signals satisfies the following expression:

$$t \geq \alpha_n \cdot P_n / I_o$$

Accordingly, exposure quantity control is performed correctly. Here, the foregoing input values from the keyboard and measured illuminance are displayed on the display of the main control system 23.

Alternatively, in FIG. 1, the output I of the integrator sensor 7 (output of the A/D converter 9) may be directly supplied to the exposure controller 11 and the value obtained when this output I is divided by its correlation coefficient $\alpha$ may be integrated within the exposure controller 11 such that the emission at the excimer laser light source 1 is terminated at the time when thus integrated value reaches the cutoff level with respect to the set exposure quantity.

The main control system 23 in FIG. 1 may perform a normal exposure quantity control operation by using the correlation coefficient $\alpha_i$ for the current illumination condition. Accordingly, for all the illumination conditions, the exposure quantity control which has been calibrated with respect to the reference illuminance meter 18 can be effected. As a result, exposure quantities under all the illumination conditions among a plurality of projection exposure apparatuses become interchangeable. Normally, however, it is sufficient for them to be interchangeable under a common illumination condition among a plurality of projection exposure apparatuses.

The foregoing processes refer to the case where the range necessary for the integrator sensor 7 under each illumination condition is relatively narrow and the linearity with respect to the reference illuminance meter 18 is obtained by a primary approximate line within this range. A projection exposure apparatus using, as the exposure light source 1, a mercury lamp or the like which outputs continuous light such as that of g-line or i-line may also be applied to the above-mentioned exposure apparatus. Also, the foregoing processes are effective in the case where a pulse laser light source is used as the exposure light source when the kinds of the photoresist used are limited.

In the following, the case where many kinds of photoresist are used and the output of the integrator sensor 7 has to be calibrated in a wider range will be explained. This case corresponds to the current state in which a KrF excimer laser light source is used while employing a plurality of kinds of photoresist.

Though the following explanation is restricted to one illumination condition as a matter of convenience, the operations hereinafter are performed in all the necessary illumination conditions.

Figure 3:
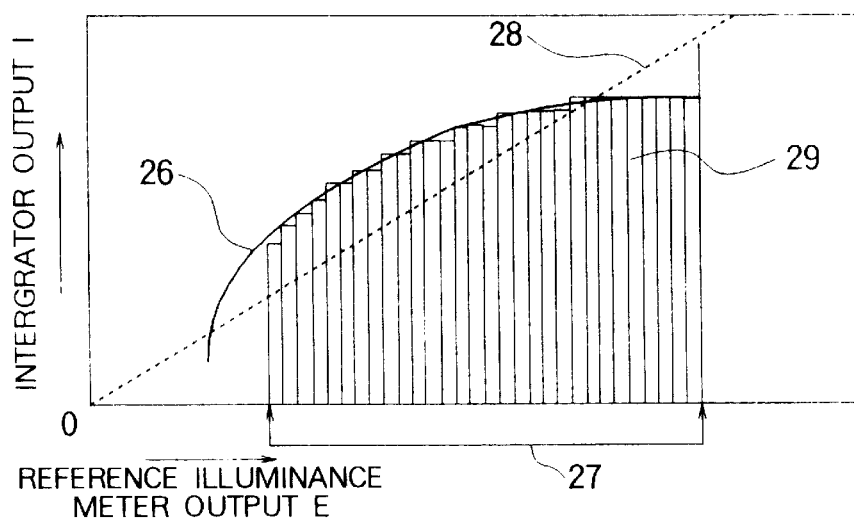
FIG. 3 is a chart showing a nonlinear correlation between the output of the reference illuminance meter 18 and the output of the integrator sensor 7 measured in the above-mentioned embodiment under one illumination condition.

FIG. 3 shows a data (correlation data) indicating the relationship between the output E [mJ/(cm$^2$pulse)] of the reference illuminance meter 18 and output I [digit/pulse] of the integrator sensor 7 obtained under this one illumination condition. In FIG. 3, the nonlinearity of an actually measured correlation curve 26 is shown exaggeratingly. The line which is applied to this correlation curve 26 by the method of least squares is depicted as a least square approximate line 28. A range 27 in the output E of the reference illuminance meter 18 in the horizontal axis indicates a range within which the output I of the integrator sensor 7 in the vertical axis has to be calibrated.

As can be seen from FIG. 3, since the nonlinearity of the correlation curve 26 is high, within the range 27 necessitating calibration, linearity cannot sufficiently be attained by the least square approximate line 28 with respect to the output E of the reference illuminance meter 18. Accordingly, when the exposure quantity control is effected with respect to various kinds of photoresist within a wide range by using the output I of the integrator sensor 7 which has been calibrated by one correlation coefficient $\alpha$ which is the gradient of the least square approximate line 28, a desired linearity in the exposure quantity cannot be obtained with respect to the reference illuminance meter 18. Therefore, in step 9 (S9) in FIG. 7, a correlation function is determined by using the techniques such as those explained hereinafter.

In this case, as the first technique, the correlation curve 26 is approximated by not a primary function but a secondary or higher order function J(E) of the output E [mJ/(cm$^2$ pulse)] of the reference illuminance meter 18. In this case, in response to the correlation coefficient $\alpha$ which is the gradient of the primary function, correlation function $\alpha$ (I) at the output I [digit/pulse] of the integrator sensor 7 is defined as expressed by the following equation. Here, the output E in the following equation is a value determined so as to satisfy I=J(E) with respect to the output I.

$$\alpha(I) = J(E)/E \qquad \text{(equation 3)}$$

Namely, when the output of the integrator sensor 7 becomes I [digit/pulse] during the exposure operation, the exposure energy E on the image surface can be determined as this output I is divided by its corresponding correlation function $\alpha$ (I). Thus, after performing step 1 to step 8 (S1 to S8) in FIG. 7, from the correlation data between thus obtained output E of the reference illuminance meter 18 and output I of the integrator sensor 7, the exposure controller 11 computes the high-order function J(E) and correlation function $\alpha$ (I) indicating the relationship between these outputs. Thereafter, like the processes shown in FIG. 8, the exposure quantity control is performed in the processes shown in FIG. 9.

Figure 9:
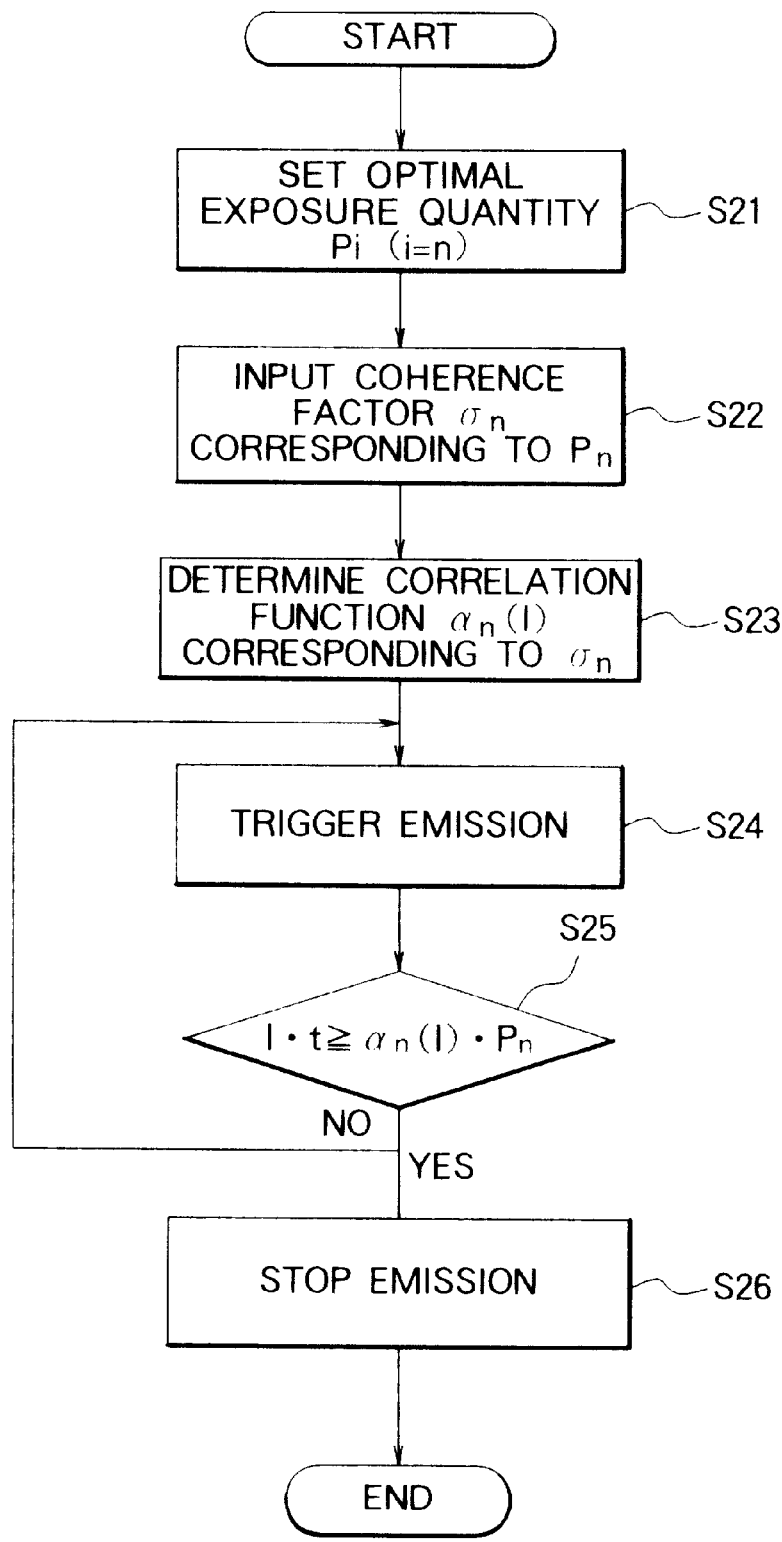
FIG. 9 is a flow chart for explaining a control operation of the exposure apparatus.

In the case where the exposure controller 11 performs a cutoff control of emission while using equation 3 as the correlation function will be explained with reference to FIG. 9. First, from the keyboard K, the optimal exposure quantity $P_i$ (i=n) is input into the computer 23A (S21). When this command is input, the main control system 23 instructs the exposure controller 11 about it. Here, this setting may be effected in view of the pattern of the reticle 13. When the optimal exposure quantity is $P_i$ (i=n), the optimal coherence factor $\sigma_i$ is univocally determined. From the keyboard K, the coherence factor $\sigma_i$ (i=n) is input into the computer 23A (S22). When this command is input, the main control system 23 instructs the exposure controller 11 about it. When this command is input into the exposure controller 11, since the corresponding relationship between the correlation function $\alpha_i$ (I) and value $\sigma_i$ has been stored within the memory M1, correlation function $\alpha_n$ (I) is determined (S23).

The optimal exposure quantity $P_i$ is obtained when the exposure energy E (output of the reference illumination meter 18) per pulse of the exposure light irradiating the photoresist is multiplied by the pulse number t. Namely, $P_i = E \cdot t$. Accordingly, when the correlation function is $\alpha_i(I)$, $\alpha_i(I) \cdot P_i = I \cdot t$ is derived from equation 3. Accordingly, when the illuminance (energy) measured by the reference illuminance meter 18 is E, the output (I·t) of the integrator sensor 7 integrated by the integrator 10 equals $\alpha_i(I) \cdot P_i$. Namely, this relationship is indicated by the following equation 4:

$$\alpha_i(I) \cdot P_i = I \cdot t \quad \text{(equation 4)}$$

Here, $P_n$ and $\alpha_n(I)$ are input into the optimal exposure quantity $P_i$ and the correlation coefficient $\alpha_i$ (I) at step 21 (S21) and step 23 (S23), respectively.

After the correlation coefficient $\alpha_n$ (I) is determined, the exposure operation is performed in the following manner. First, an emission command is input from the keyboard K into the computer 23A. When this command is input, the main control system 23 instructs the exposure controller 11 about it. In response to this instruction, the exposure controller 11 transmits a trigger signal to the light source 1 (S24). Accordingly, the excimer laser light source 1 is subjected to pulse emission. From the time when the exposure is started, the exposure controller 11 always senses the output (I·t) of the integrator 10 (S25). When the exposure controller 11 judges that this output (I·t) equals or exceeds $\alpha_n(I) \cdot P_n$, it stops supplying the trigger signal to the light source 1, thereby terminating the emission at the light source 1 (S26). Namely, the exposure controller 11 transmits the trigger signal to the light source 1 until the number t of the trigger signals satisfies the following expression:

$$t \geq \alpha_n(I) \cdot P_n / I_o$$

Accordingly, exposure quantity control is performed correctly. Here, the foregoing input values from the keyboard and measured illuminance are displayed on the display of the main control system 23.

Alternatively, in FIG. 1, the output I of the integrator sensor 7 (output of the A/D converter 9) may be directly supplied to the exposure controller 11 and the value obtained when this output I is divided by its correlation function $\alpha$ (I) may be integrated within the exposure controller 11 such that the emission of the excimer laser light source 1 is terminated at the time when thus integrated value reaches the cutoff level with respect to the set exposure quantity.

As the second technique, the correlation curve 26 in FIG. 3 may be approximated by a correlation map 29 of a predetermined step concerning the output E of the reference illuminance meter 18 in place of the high-order function J(E). In this case, the resolution of the correlation map 29 is set so as to attain a desired accuracy in approximation. When the detected output I of the integrator sensor 7 is divided by the correlation coefficient $\alpha$ (i.e., value obtained when the output I is divided by the output E of the reference illuminance meter 18) corresponding to this output I in the correlation map 29, the exposure energy on the image surface is determined.

Though the output I of the integrator sensor 7 is converted into the exposure energy on the image surface by using the correlation function $\alpha(I)$ or correlation coefficient $\alpha$ per pulse illumination light in the foregoing steps, a technique which is easier in terms of control will be explained in the following.

Before exposure, in such a frequency as per wafer or per lot, the integrator sensor 7 is used to check the energy of the pulse illumination light and, when extinction is necessary, the correlation data between the output I of the integrator sensor 7 and the output E of the reference illuminance meter 18 is measured while extinction is made by way of the energy extinction unit 3. Before exposure, the exposure controller 11 computes the correlation function $\alpha$ (I) or correlation coefficient $\alpha$ used for the exposure from the correlation map or equation 3. First, as an exposure quantity control operation, for example, a set exposure quantity P' is multiplied by thus determined correlation coefficient $\alpha$ or correlation function $\alpha(I)$ so as to be converted into a set value P'$\alpha$ or P'$\alpha$ (I) [digit] for the output I of the integrator sensor 7.

During the exposure thereafter, without converting the output I of the integrator sensor 7 into the exposure energy per pulse illumination light, a cutoff control operation in terms of digital quantity is performed, by using the set value P'$\alpha$ or P'$\alpha$ (I) as a target value, until a value I·t obtained when a constant I is multiplied by the pulse number t equals or exceeds this target value. In this case, the energy of the pulse illumination light may fluctuate among pulses by about ±10%. Accordingly, the correlation within this range of ±10% is represented by the correlation coefficient $\alpha$ of the primary approximation. Within this narrow range of ±10%, in most cases, the error in the exposure quantity control according to this primary approximation can be considered sufficiently small.

One of the foregoing processes using the correlation coefficient $\alpha$, correlation function $\alpha$ (I), or correlation map is performed for all the illumination conditions. Accordingly, a correct correlation coefficient or correlation function between the output I of the integrator sensor 7 and the output E of the reference illuminance meter 18 can be obtained in a wide range covering all the illumination conditions. However, as mentioned above with reference to FIG. 2, when the range necessitating the correct correlation data (range corresponding to ranges 25A to 25C in FIG. 2) is, due to the $\sigma$ value of the illumination system, so narrow that a sufficient correlation can be attained by a single value of the correlation coefficient $\alpha$, the lowest order of control, i.e., its primary approximate control, is sufficient therefor.

In the above-mentioned example, the correlation data between the output of the integrator sensor 7 and the output of the reference illuminance meter 18 has to be acquired for all the illumination conditions. Since it not only increases the number of steps in measuring operation but may require frequent calibration of the integrator sensor 7 with respect to the reference illuminance meter 18, it is desirable that a series of output calibrating operations for the integrator sensor 7 be done in a short time. The following technique for calibrating the output I of the integrator sensor 7 in a short time, in general, is effective and realistic with respect to a stepper using a mercury lamp or the like in which no exposure quantity control based on extinction of the exposure light is necessary. Namely, since the output I detected by the integrator sensor 7 is substantially constant except for periods during which the exposure light is adjusted by opening or closing a shutter, it is assumed to have a value of the correlation coefficient α for each illumination condition.

Therefore, as shown in FIG. 1, there is used the illuminance fluctuation sensor 19 which is a sensor on the image surface, as in the case of the reference illuminance meter 18, and used for measuring the fluctuation in illuminance within an illumination field of the projection optical system 14 (method A). Like the reference illuminance meter 18, this illuminance fluctuation sensor 19 is assumed to be isotropic with respect to the incident angle of the incident light such that its output has a sufficient linearity with respect to the incident energy within the range on the order of the energy loss due to the σ stop SA.

Figure 7:
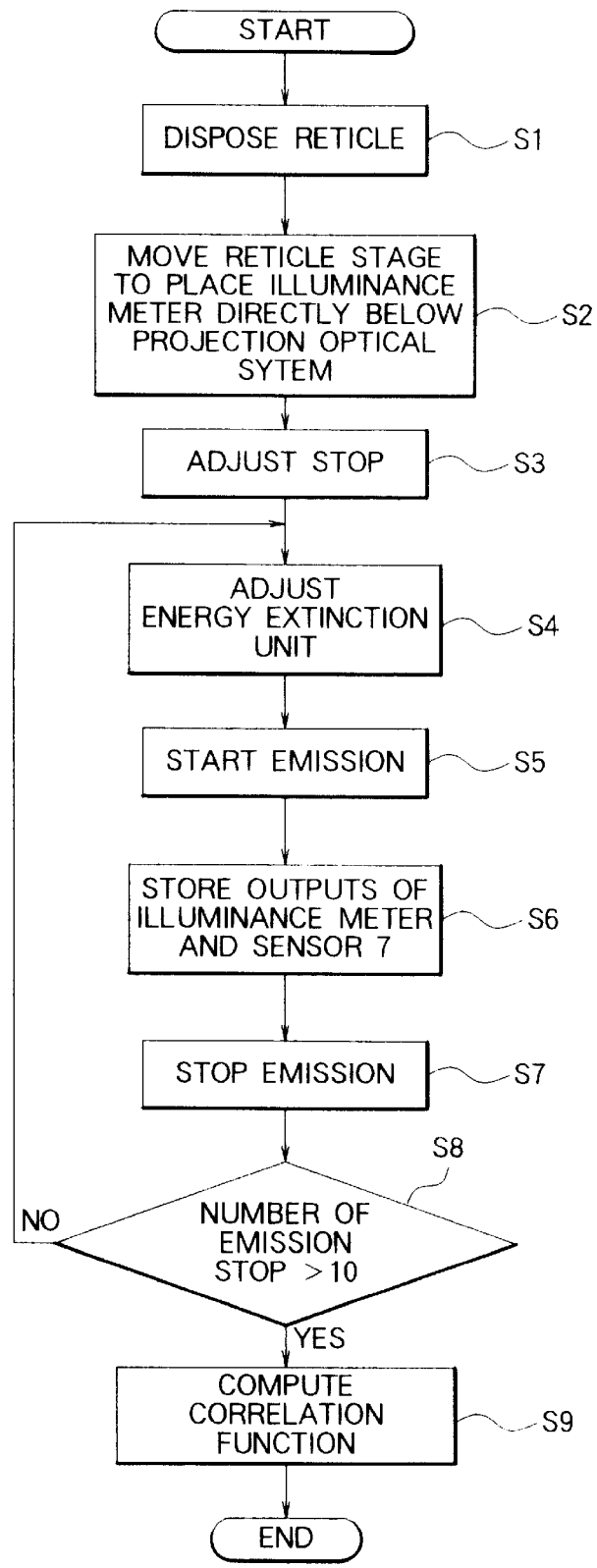
FIG. 7 is a flow chart for explaining a control operation of the exposure apparatus.

First, by means of the a stop 5A, the σ value of the illumination system is set to the standard σ under the most frequently used illumination condition and then, in a manner similar to the processes shown in FIG. 7, the normal output of the integrator sensor 7 is calibrated with respect to the reference illuminance meter 18 so as to determine a correlation coefficient α. The correlation coefficient a at this time may be a correlation coefficient at a single point in the state where the shutter is open. Thus determined correlation coefficient α is defined as correlation coefficient $\alpha_{std}$. Though the same procedure may be effected for all the illumination conditions, since it takes time, the illumination fluctuation sensor 19 on the same image surface is used for the other illumination conditions here.

Under the illumination condition with this standard σ, the wafer stage 17 is driven so as to move the light-receiving portion of the illuminance fluctuation sensor 19 to a measuring point within the same illumination field (center of the illumination field, in general) where the reference illuminance meter 18 is placed. At this time, ratio $R_{std}$ of the output I of the integrator sensor 7 to the output Q of the illuminance fluctuation sensor 19 is determined as follows:

$$R_{std}=I/Q \quad \text{(equation 5)}$$

Next, by means of the σ stop 5A, the σ value of the illumination system is changed to $\sigma_i$ (i=1, 2, . . . ). Then, in a similar manner, for each σ value $\sigma_i$, ratio $R_i$ (=I/Q) of the output I of the integrator sensor 7 to the output Q of the illuminance fluctuation sensor 19 is determined. Subsequently, at this σ value $\sigma_i$, correlation coefficient $\alpha_i$ for computing the exposure energy on the image surface from the output I of the integrator sensor 7 is determined by the following equation:

$$\alpha_i=(R_i/R_{std})\cdot\alpha_{std} \quad \text{(equation 6)}$$

Namely, the correlation coefficient $\alpha_i$ under the illumination condition with this σ value $\sigma_i$ is indirectly measured by way of the illuminance fluctuation sensor 19 on the same image surface. Here, when a measurement error occurs at the time of measuring the ratio $R_i$ in equation 6, it results in an error in the correlation coefficient $\alpha_i$. Accordingly, when the mean value of the ratio $R_i$ at the time of measurement is computed from the reproducibility of measurement in each of the integrator sensor 7 and illuminance fluctuation sensor 19 in itself so as to appropriately set the $R_i$ used in equation 6, the error in the correlation coefficient $\alpha_i$ can be sufficiently suppressed to a small value. Subsequently, the correlation coefficient $\alpha_i$ is indirectly determined for all the illumination conditions in a similar manner. Since the reference illuminance meter 18 is usually used off-line due to its characteristic, the method in which the illuminance fluctuation sensor 19 is used in the above-mentioned manner is quite convenient.

The main control system 23 shown in FIG. 1 uses the correlation coefficient α for the current illumination condition so as to perform a normal exposure quantity control operation. Accordingly, for all the illumination conditions, it becomes possible to perform the exposure quantity control calibrated with respect to the reference illuminance meter 18. As a result, exposure quantities under all the illumination conditions among a plurality of projection exposure apparatuses become interchangeable. Normally, however, it is sufficient for them to be interchangeable under a common illumination condition among a plurality of projection exposure apparatuses.

Though the illuminance fluctuation sensor 19 is used in this example, any sensor may be used as long as it is permanently disposed on the image surface and there is no problem concerning its angular characteristic and linearity.

Also, in the stepper or the like in which a mercury lamp or the like is used as its exposure light source, the output of the integrator sensor 7 is calibrated with respect to the reference illuminance meter at the standard σ as indicated by method A, for example, at the time when the lamp is changed, a series of measurement sequences for the foregoing steps 9 and 10 may be batch-processed with respect to the other illumination conditions, thereby making these steps very simple.

Further, it is clear that the present invention can be similarly applied to the case where the exposure quantity control is effected by a scan exposure type exposure apparatus such as that of a step and scan type system in which, while a part of a pattern of a reticle is projected onto a wafer, the reticle and the wafer are scanned in synchronization with each other such that the reticle pattern is successively transferred to the respective shot areas on the wafer. Thus, without being restricted to the foregoing embodiment, the present invention can have various kinds of configurations within a scope which does not deviate from the gist of the invention.

The first exposure apparatus of the present invention is advantageous in that, since the exposure quantity computing means stores, for each of a plurality of illumination conditions of the illumination optical system, a calibration value for computing the exposure quantity on the substrate from the photoelectrically converted signal of the photodetector, even when the illumination conditions are changed over in one exposure apparatus, an appropriate exposure quantity based on the illuminance meter can be correctly provided with respect to the substrate (wafer or the like) under each illumination condition. Also, the interchangeability of the exposure quantities under a plurality of illumination conditions among a plurality of exposure apparatuses is improved.

Also, the second exposure apparatus of the present invention is advantageous in that, since the exposure quantity computing means stores a calibration function or calibration map for computing the exposure quantity on the substrate from the photoelectrically converted signal of the photodetector which has been determined as the output signal of the reference illuminance meter and the photoelectrically converted signal of the photodetector are compared with each other while the illuminance of the illumination light is changed within a predetermined range, even when the illuminance of the illumination light (exposure light) used for exposure is changed within a wide range, an appropriate exposure quantity can be correctly provided with respect to the substrate within this whole wide range. Also, the interchangeability of the exposure quantities with respect to a wide range of sensitivity of a photosensitive material such as photoresist among a plurality of exposure apparatuses is improved.

In the following, the advantages of the present invention will be explained.

A projection exposure apparatus (stepper or the like) is used for transferring a pattern of a reticle, as a mask, by way of a projection optical system, onto each shot area on a wafer (or glass plate or the like) on which a photoresist is coated, in order to manufacture a semiconductor device or the like. Such a projection exposure apparatus preferably has, as one of its basic functions, an exposure quantity control function for maintaining, within an appropriate range, the exposure quantity (integrated exposure energy) with respect to each point within each shot area.

As an exposure quantity controlling method which can be compared with the present invention, there has been known a method in which a part of the exposure light is separated in the illumination optical system and received by a photo-electric sensor (integrator sensor) which has sufficient sensitivity and response speed with respect to this exposure light such that the exposure quantity with respect to the wafer is indirectly monitored from the output signal of this integrator sensor in real time. In this case, a primary correlation function between the output of the integrator sensor and the output (indicated as energy) of a predetermined reference illuminance meter disposed on the projection surface for the reticle pattern (surface where the wafer is disposed) is determined so as to calibrate the output signal of the integrator sensor with respect to the exposure quantity (referred to as "exposure quantity absolute value") measured by the reference illuminance meter, whereby the output of the integrator sensor during the exposure time is integrated to determine the exposure quantity with respect to the wafer.

Also, it is assumed that the standard form of the aperture stop (secondary light source) of the illumination optical system in the projection exposure apparatus is circular while its size and, accordingly, so-called coherence factor ($\sigma$ value) are set to their fixed values within the apparatus. However, it is more preferable in a lithography process that optimal coherence factors and numerical apertures of the projection optical system be selectively used according to the form and size of the pattern for each layer on the wafer. Further, a super-resolution technique in which the form of the secondary light source, for example, is modified so as to improve the resolution and depth of focus can be considered. Accordingly, it is important to use a plurality of kinds of illumination conditions, in a switching manner, within one projection exposure apparatus.

On the other hand, the exposure wavelength tends to become further shorter in order to respond to the further integration of the semiconductor integrated circuit and the like. For example, a projection exposure apparatus using a KrF excimer laser light source with a wavelength of 248 nm or an ArF excimer laser light source with a wavelength of 193 nm as its exposure light source is effective. The sensitivity (necessary exposure quantity) of a highly sensitive chemically amplified resist which has recently been used in such a far ultraviolet region is, for example, less than 1/10 of the conventional photoresist for excimer laser, whereby the range of sensitivity of the photoresist handled by the projection exposure apparatus tends to become greater.

Since the excimer laser light source is a pulse light source in which emission energy per pulse emission fluctuates, exposure is effected with a plurality of pulse light components with a pulse number not lower than a predetermined value, thereby attaining a desired reproducibility in exposure quantity control. In this case, when a highly sensitive resist is exposed to light, since the set exposure quantity is too small, the output of the pulse light source itself may be lowered or the pulse light may be extinguished by an extinction means disposed in the optical path such that the exposure can be effected with the least exposure pulse number or more.

Alternatively, as a method for detecting the integrated exposure energy by the pulse light, the output signal of the integrator sensor per pulse light may be subjected to peak-hold and analog/digital conversion so as to be integrated. In this case, since the linearity of the peak-held signal with respect to the output signal of the integrator sensor is hard to maintain with a required accuracy over a wide range in terms of hardware, it is desirable that the correlation between the output of the reference illuminance meter on the image-forming surface of the projection optical system with respect to the incident pulse energy and the output of the integrator sensor be approximated by a primary function according to the method of least squares such that the sum of squares of the calibration error with respect to the output of the reference illuminance meter in the full range of the integrator sensor is minimized. Thus, a single calibration coefficient is used in the full range of the output of the integrator sensor in the exposure apparatus which is compared with the present invention. Also, in order to further substantially expand the detection range of the integrator sensor, for example, a plurality of integrator sensors may be effectively used.

As mentioned above, when a plurality of kinds of illumination conditions are used while being changed over, a primary correlation coefficient between the output of the reference illuminance meter and the output of the integrator sensor has been determined under a standard illumination condition and this correlation coefficient has been used to determine the exposure quantity on the wafer under the other illumination conditions as well. However, it has been disadvantageous in that, when the illumination condition is different from the standard condition, the exposure quantity absolute value cannot always be correctly determined under such a different condition on the basis of the above-mentioned correlation coefficient due to changes in incident angle distribution of the exposure light on the detection surface of the integrator sensor, the angular characteristic of the whole optical system for introducing the exposure light into the integrator sensor with respect to the exposure light, and the like.

Figure 4:
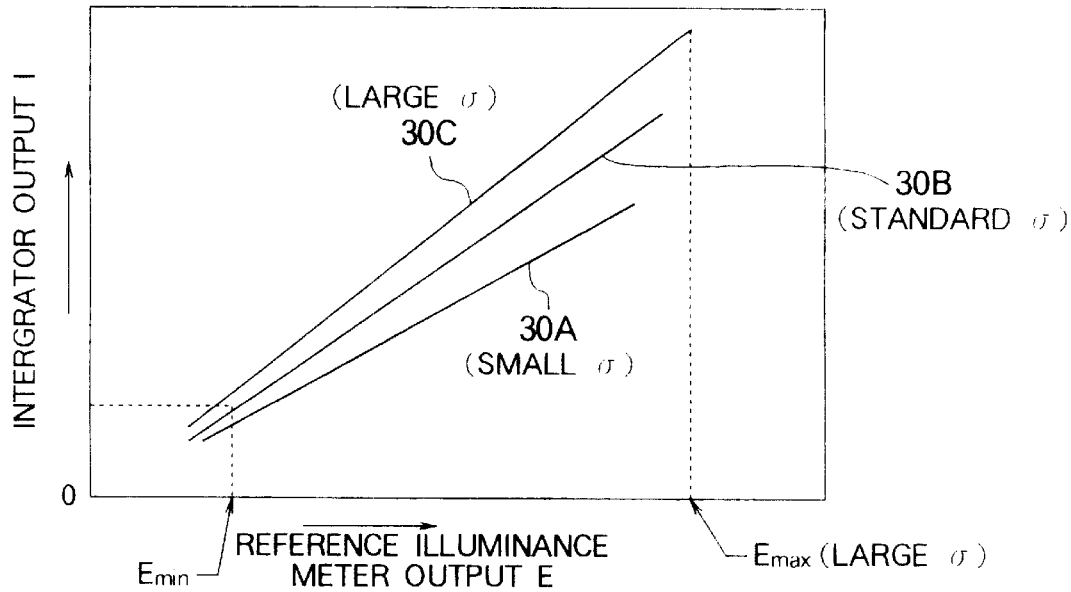
FIG. 4 is a chart showing relationships between the output of a reference illuminance meter and the output of an integrator sensor in a comparative example under various illumination conditions.

FIG. 4 shows relationships between the output E [mJ/(cm$^2$ pulse)] of the reference illuminance meter and the output I [arbitrary unit] of the integrator sensor under a plurality of illumination conditions. In FIG. 4, their relationship obtained when the coherence factor ($\sigma$ value) of the illumination optical system is set to a standard value is indicated by line 30B, whereas lines 30A and 30C respectively indicate their relationships obtained when the $\sigma$ value is set to small and large values. Also, $E_{min}$ is the minimum value at which the relationship between the outputs E and I should be represented as a line, whereas $E_{max}$ is the output of the reference illuminance meter which can be obtained without extinguishing the exposure light when the $\sigma$ value is made large. As can be seen from FIG. 4, the gradient of the output I of the integrator sensor with respect to the output E of the reference illuminance meter changes as the $\sigma$ value varies. Conventionally, however, the exposure quantity absolute value can be determined from the output of the integrator sensor by using the gradient of the line 30B (primary correlation coefficient) under all the illumination conditions. In this case, as shown in FIG. 5, when the $\sigma$ value deviates from the standard value, the exposure quantity for the wafer may have an error with respect to the actual exposure quantity (energy measured by the reference illuminance meter).

Figure 5:
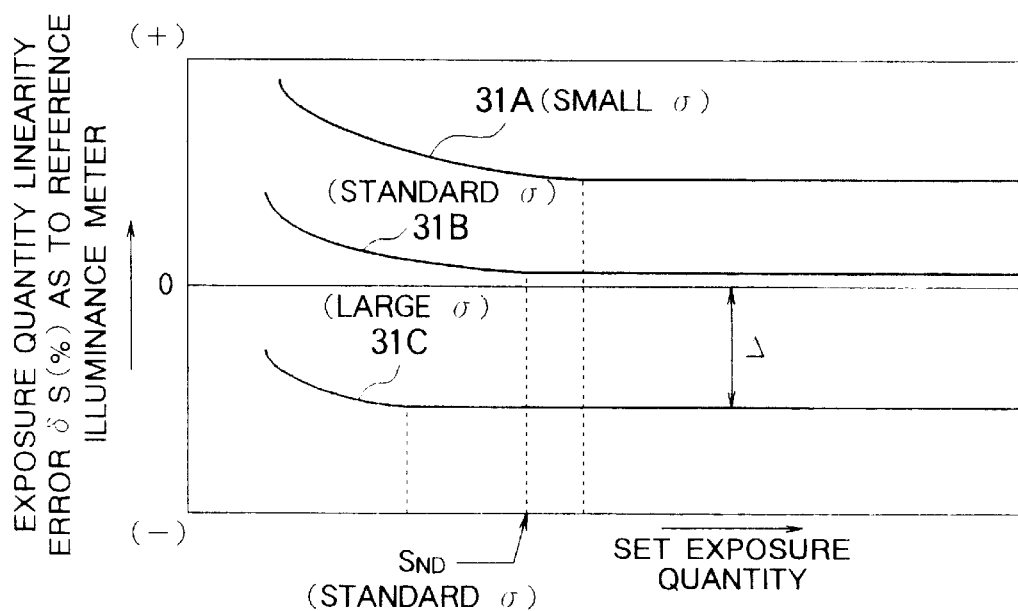
FIG. 5 is a chart showing states of error in exposure quantity in the comparative example under various illumination conditions.
Figure 6:
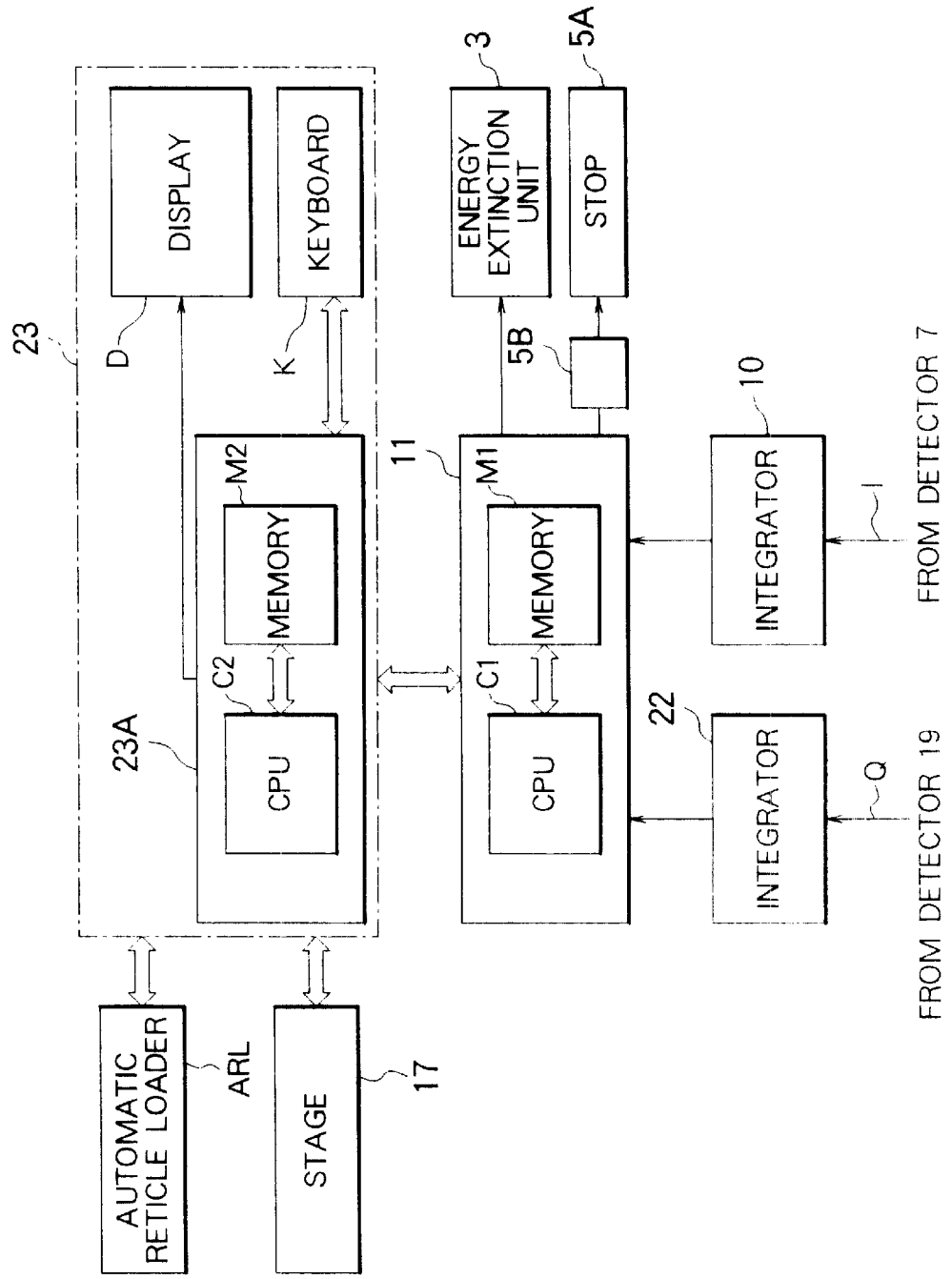
FIG. 6 is a block diagram showing details of the apparatus shown in FIG. 1.

Namely, FIG. 5 shows errors in the exposure quantity with respect to the wafer when the primary correlation coefficient represented by the line 30B in FIG. 4 is used while the set exposure quantity S [mJ/cm$^2$] is changed under a plurality of illumination conditions. In FIG. 5, the vertical axis indicates the error in the actual exposure quantity with respect to the set exposure quantity (energy measured by the reference illuminance meter), i.e., exposure quantity linearity error δS [%] with respect to the reference illuminance meter. Also, curves 31A, 31B, and 31C indicate the errors δS obtained when the σ value is set to a value smaller than the standard value, the standard value, and a value larger than the standard value, respectively. SND in the horizontal axis indicates the limit of the set exposure quantity where the extinction becomes necessary in the case of the standard σ value. In FIG. 5, as can be seen from offset error Δ of the curve 31C, for example, the error in the actual exposure quantity with respect to the set exposure quantity cannot be neglected any more when the σ value deviates from the standard value by more than a certain extent.

This offset error is an error inherent in this projection exposure apparatus. For example, when a plurality of projection exposure apparatuses are used to effect exposure in different layers on a wafer, even under a common illumination condition, the interchangeability in the exposure quantities among the projection exposure apparatuses may disadvantageously deteriorate due to fluctuations in these offset errors. Accordingly, when a plurality of illumination conditions are used while being changed over within a single projection exposure apparatus or when a plurality of projection exposure apparatuses are used in a mixed state, it becomes difficult to control the interchangeability of the exposure quantities.

Further, when a pulse light source which emits light in a far ultraviolet region such as excimer laser light source is used as the exposure light source as mentioned above, since the range of the sensitivity of the photoresist used becomes wider and there are cases where the pulse light is extinguished so as to obtain a desired least exposure pulse number, the range of the incident light quantity with respect to the integrator sensor has been increased. Accordingly, in order to attain the interchangeability of the exposure quantities over a wide range among a plurality of projection exposure apparatuses, which use their respective pulse light sources, the integrator senor has to be calibrated in a wide range with respect to the reference illumination meter.

Also, in particular, a highly sensitive chemically amplified resist has a narrow tolerance for the exposure quantity error in general. Accordingly, when a plurality of projection exposure apparatuses are used while employing the chemically amplified resist, it is important to maintain not only the reproducibility of the exposure quantity but also the accuracy in exposure quantity interchangeability within a predetermined narrow tolerance range.

In view of this point, the present invention provides an exposure apparatus which can supply, even when illumination conditions are changed over in one exposure apparatus, an appropriate exposure quantity to the wafer under each illumination condition.

Also, the present invention provides an exposure apparatus which can supply, even when the illuminance of the illumination light (exposure light) used for exposure is changed in a wide range, an appropriate exposure quantity to the wafer in this whole wide range.

The first exposure apparatus in accordance with the present invention has an illumination optical system 1 to 5A and 12 for illuminating, under a predetermined illumination condition selected from a plurality of illumination conditions, a mask 13, in which a transfer pattern is formed, with exposure illumination light under which the pattern of the mask 13 is transferred onto a photosensitive substrate 16. This exposure apparatus further comprises a photoelectric detector 7 for receiving a luminous flux separated from the illumination light and an exposure quantity computing means 11 for computing, from a photoelectrically converted signal of this photoelectric detector, the exposure quantity of the illumination light on the substrate 16. This exposure quantity computing means stores a calibration value (including correlation coefficient, correlation function, correlation map, and the like) for computing the exposure quantity on the substrate 16 from the photoelectrically converted signal of the photoelectric detector 7 for each of the plurality of illumination conditions in the above-mentioned illumination optical system.

In this first exposure apparatus of the present invention, under each illumination condition, the output of a reference illumination meter 18 on the surface where the substrate 16 is disposed and the photoelectrically converted signal of the photoelectric detector 7, for example, are compared with each other so as to determine its calibration value beforehand. Then, under each illumination condition, from this calibration value and the photoelectrically converted signal of the photoelectric detector 7, the exposure quantity on the substrate 16 is correctly measured. Accordingly, based thereon, an appropriate exposure quantity can be supplied to the substrate 16.

The second exposure apparatus in accordance with the present invention has an illumination optical system 1 to 5A and 12 for illuminating, under a predetermined illumination condition, a mask 13, in which a transfer pattern is formed, with exposure illumination light under which the pattern of the mask 13 is transferred onto a photosensitive substrate 16. This exposure apparatus further comprises a photoelectric detector 7 for receiving a luminous flux separated from the illumination light and an exposure quantity computing means 11 for computing, from a photoelectrically converted signal of this photoelectric detector, the exposure quantity of the illumination light on the substrate 16. Under this predetermined illumination condition, a reference illumination meter 18 is disposed on the surface where the substrate 16 is disposed and a calibration function (correlation function or the like) or calibration map for computing the exposure quantity on the substrate 16 from the photoelectrically converted signal of the photoelectric detector 7 which is determined as the output signal of the reference illuminance meter 18 and the photoelectrically converted signal of the photoelectric detector 7 are compared with each other while the illuminance of the illumination light is changed within a predetermined range is stored in the exposure quantity computing means 11, whereas the respective calibration coefficients or calibration maps for other necessary illumination conditions are determined and stored in the exposure quantity computing means 11.

In this second exposure apparatus of the present invention, under the predetermined illumination condition, the output of the reference illumination meter 18 and the photoelectrically converted signal of the photoelectric detector 7 in the full range of the photoelectric detector 7, for example, are compared with each other so as to determine its calibration function beforehand. Then, under this predetermined illumination condition, from this calibration function and the photoelectrically converted signal of the photoelectric detector 7, the exposure quantity on the substrate 16 is correctly measured over the full range. Further, when these first and second exposure apparatuses are combined together, under each of a plurality of illumination conditions, the exposure quantity on the substrate 16 is correctly measured, for example, over the full range of the photoelectric detector 7.

Also, the third exposure apparatus in accordance with the present invention has an illumination optical system 1 to 5A and 12 for illuminating, under a predetermined illumination condition selected from a plurality of illumination conditions, a mask 13, in which a transfer pattern is formed, with exposure illumination light under which the pattern of the mask 13 is transferred onto a photosensitive substrate 16. This exposure apparatus further comprises a first photoelectric detector 7 for receiving a luminous flux separated from the illumination light, an exposure quantity computing means 11 for computing, from a photoelectrically converted signal of this first photoelectric detector, the exposure quantity of the illumination light on the substrate 16, and a second photoelectric detector permanently disposed on the surface where the substrate 16 is disposed. Under a standard illumination condition in the plurality of illumination conditions, an output signal of a predetermined reference illuminance meter 18 and the photoelectrically converted signal of the first photoelectric signal 7 are compared with each other so as to determine a first calibration value for computing the exposure quantity on the substrate 16 from the photoelectrically converted signal of the first photoelectric detector 7. Also, under each of this standard illumination condition and all the other illumination conditions, a photoelectrically converted signal of the second photoelectric detector 19 and the photoelectrically converted signal of the first photoelectric detector 7 are compared with each other so as to determine a second calibration value for computing the exposure quantity on the substrate 16 from the photoelectrically converted signal of the first photoelectric detector 7. Then, these first and second calibration values are stored in the exposure quantity computing means 11.

In this third exposure apparatus of the present invention, the exposure quantity on the substrate 16 under its standard illumination condition is measured from its first calibration value and the photoelectrically converted signal of the first photoelectric detector 7, whereas the exposure quantity on the substrate 16 under the other illumination conditions is measured from its second calibration value and the photoelectrically converted signal of the first photoelectric detector 7.

Further, when the first and second inventions are combined together, even when a plurality of illumination conditions are used among a plurality of exposure apparatuses, a favorable accuracy in the exposure quantity control can be obtained with respect to a wide range of sensitivity of photosensitive materials under all the illumination conditions, thereby improving the interchangeability of the exposure quantities among the exposure apparatuses as well.

Also, in the third exposure apparatus of the present invention, since, under the illumination conditions other than the standard illumination condition, the photoelectrically converted signal of the second photoelectric detector and the photoelectrically converted signal of the first photoelectric detector are compared with each other so as to determine the second calibration value for computing the exposure quantity on the substrate from the photoelectrically converted signal of the first photoelectric detector, the measurement time can be reduced. Further, it is advantageous in that, even when illumination conditions are changed over in one exposure apparatus, an appropriate exposure quantity can be correctly supplied to the substrate under each illumination condition.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 299477/1995 (7-299477) filed on Nov. 17, 1995 is hereby incorporated by reference.

What is claimed is:

1. A method of controlling exposure in which an object on a stage is exposed to light with a desired exposure quantity, said method comprising the steps of:

selecting an aperture size of an aperture stop which can vary said aperture size;

detecting a part of light passed through said aperture stop by a photodetector;

calibrating an output of said photodetector based on the aperture size of said aperture stop;

detecting a part of light on said stage by an illuminance meter; and storing a correlation function between an output of said photodetector and an output of said illuminance meter corresponding to each aperture size of said aperture stop, wherein said correlation function is:

$$I=\alpha(I)E$$

wherein I is the output of said photodetector, $\alpha(I)$ is a high-order function which corresponds to the aperture size and depends on the output I, and E is the output of said illuminance meter.

2. A method according to claim 1, further comprising the step of:

varying an extinction ratio of light based on the aperture size of said aperture stop.

3. A method according to claim 1, wherein said light contains pulse light in response to input of a trigger signal, said input of the trigger signal satisfies the following expression:

$$t \geq \alpha(I)P/I$$

wherein t is a number of trigger signals and P is said desired exposure quantity.

4. A method according to claim 1, further comprising the step of:

emitting a plurality of secondary light sources from said light.

5. A method of illuminating with exposure illumination light under which the pattern of a mask is transferred onto a photosensitive substrate, said method comprising:

receiving a luminous flux separated from said illumination light and outputting a signal of the luminous flux;

calculating an exposure quantity of said illumination light on said substrate based on said signal of the luminous flux; and storing correlation values for computing the exposure quantity on said substrate from said signal, said correlation values corresponding to each of a plurality of illumination conditions in said exposure illumination light, wherein a correlation function is:

$$I=\alpha(I)E$$

wherein I is said signal of the luminous flux, α(I) is a high-order function which corresponds to the illumination condition, and E is an exposure energy on said photosensitive substrate.

6. A method according to claim 5, wherein said plurality of illumination conditions include a plurality of aperture sizes of said aperture stop.

7. A method according to claim 5, wherein said illumination light contains pulse light in response to input of a trigger signal, said input of the trigger signal satisfies the following expression:

$$t \geq \alpha(I)P/I$$

wherein t is a number of trigger signals and P is a desired exposure quantity.

8. A method of illuminating with exposure illumination light under which the pattern of said mask is transferred onto a photosensitive substrate, said method comprising:
receiving a luminous flux separated from said illumination light and outputting a signal of the luminous flux;
calculating an exposure quantity of said illumination light on said substrate based on said signal of the luminous flux; and
storing correlation coefficients or correlation maps for computing the exposure quantity on said substrate from said signal, said correlation coefficients or correlation maps corresponding to each of a plurality of illumination conditions in said exposure illumination light, wherein a correlation function is:

$$I = \alpha(I)E$$

wherein I is said signal of the luminous flux, α(I) is a high-order function which corresponds to the illumination condition, and E is an exposure energy on said photosensitive substrate.

9. A method according to claim 8, wherein said plurality of illumination conditions include a plurality of aperture sizes of said aperture stop.

10. A method according to claim 8, wherein said illumination light contains pulse light in response to input of a trigger signal, said input of the trigger signal satisfies the following expression:

$$t \geq \alpha(I)P/I$$

wherein t is a number of trigger signals and P is a desired exposure quantity.

11. An exposure method for exposing a substrate by illuminating a pattern of a mask with exposure light and projecting an image of said pattern onto said substrate via a projection optical system, said method comprising the steps of:
using a reference photodetector among a plurality of exposure apparatuses to detect energy of said exposure light on an image surface side of said projection optical system under a plurality of illumination conditions; and
determining exposure quantity control data corresponding to said plurality of illumination conditions respectively on the basis of a result of detection by said reference photodetector.

12. An exposure method according to claim 11, further comprising the step of detecting energy of a portion of said exposure light by a second detector other than said reference photodetector and closer to a light source than said reference photodetector, when said exposure light is detected by said reference photodetector, and
wherein said step of determining said exposure quantity control data comprises determining said exposure quantity control data on the basis of a result of detection by said second detector and the result of detection by said reference photodetector.

13. An exposure method according to claim 12, wherein said exposure quantity control data includes correlated data in relation to the result of detection by said second detector and the result of detection by said reference photodetector.

14. An exposure method according to claim 11, further comprising the steps of:
detecting energy of a portion of said exposure light by a second detector an optical path of said exposure light, and
controlling an integrated exposure quantity on said substrate on the basis of a result of detection by said second detector and said exposure quality control data.

15. An exposure method according to claim 14, wherein said step of controlling said integrated exposure quantity comprises the operations of monitoring an integrated value of said exposure light irradiating said substrate in an optical path of said exposure light and controlling the irradiation of said exposure light to said substrate on the basis of said integrated value and a preset exposure quantity to said substrate.

16. An exposure method according to claim 15, wherein said step of controlling said integrated exposure quantity comprises cutoff control of said exposure light.

17. An exposure method according to claim 11, wherein said exposure quantity control data is used to obtain interchangeability of exposure quantity to said substrate between said plurality of exposure apparatuses among which said reference photodetector is used.

18. An exposure method according to claim 11, wherein said reference photodetector is disposed detachably on a substrate stage for holding said substrate.

19. An exposure method according to claim 11, wherein said plurality of illumination conditions includes a difference in distribution state of said exposure light in a predetermined plane in an optical path of said exposure light.

20. An exposure method according to claim 19, wherein the difference in distribution state of said exposure light in said predetermined plane includes a large difference of a stop in said predetermined plane.

21. An exposure method according to claim 11, wherein said exposure light is pulse light, and further comprising the step of controlling emission of said pulse light on the basis of said exposure quantity control data.

22. An exposure method for exposing a substrate by illuminating a pattern of a mask with exposure light and projecting an image of said pattern onto said substrate via a projection optical system, said method comprising the steps of:
obtaining first exposure quantity control data by using a reference illuminance meter to detect energy of said exposure light on an image surface side of said projection optical system under a first illumination condition;
obtaining a first signal outputted from a photodetector disposed on a stage for holding said substrate when energy of said exposure light is detected by said photodetector under the first illumination condition;
obtaining a second signal outputted from said photodetector when the energy of said exposure light is detected by said photodetector under a second illumination condition differing from the first illumination condition; and obtaining second exposure quantity control data under the second illumination condition on the basis of said first exposure quantity control data, said first signal and said second signal.

23. An exposure method according to claim 22, further comprising the step of:

detecting energy of a portion of said exposure light under said first and said second illumination conditions by a second detector other than said reference illuminance meter and said photodetector, said second detector being disposed closer to a light source that provides said exposure light than said reference illuminance meter and said photodetector, and wherein said first exposure quantity control data includes correlated data in relation to a result of detection by said second detector and the result of detection by said reference illuminance meter, and said second exposure quantity control data includes correlated data in relation to the result of detection by said second detector and the energy of said exposure light on said substrate.

24. An exposure method according to claim 23, wherein said second exposure quantity control data is obtained on the basis of said first exposure quantity control data, the ratio of the result of detection by said second detector under the first illumination condition to said first signal, and the ratio of the result of detection by said second detector under the second illumination condition to said second signal.

25. An exposure method according to claim 22, further comprising the steps of:

controlling an integrated exposure quantity to said substrate under the first illumination condition on the basis of said first exposure quantity control data; and controlling an integrated exposure quantity to said substrate under the second illumination condition on the basis of said second exposure quantity control data.

26. An exposure method according to claim 22, wherein said photodetector detects energy of a portion of exposure light irradiating said stage.

27. An exposure method according to claim 22, wherein said photodetector detects said exposure light via a pinhole.

28. An exposure method according to claim 27, wherein said reference illuminance meter is disposed detachably on said stage.

29. An exposure method according to claim 28, wherein said reference illuminance meter is used among a plurality of exposure apparatuses and obtains interchangeability of exposure quantity to said substrate between said plurality of exposure apparatuses on the basis of said first exposure quantity control data and said second exposure quantity control data.

30. An exposure method according to claim 22, wherein exposure light is pulse light, and further comprising a step of controlling the emission of said pulse light on the basis of said first exposure quantity control data and said second exposure quantity control data.

* * * * *

UNITED STATES PATENT AND TRADEMARK OFFICE
CERTIFICATE OF CORRECTION

PATENT NO. : 5,965,308
DATED : October 12, 1999
INVENTOR(S) : Ken OZAWA

It is certified that error appears in the above-identified patent and that said Letters Patent is hereby corrected as shown below:

Title page item [73] Assignee, delete "Nixon Corporation" and replace with --Nikon Corporation--

Signed and Sealed this

Twenty-seventh Day of June, 2000

Attest:

Q. TODD DICKINSON

Attesting Officer

Director of Patents and Trademarks